(12) United States Patent
Geisberger

(10) Patent No.: US 8,810,030 B2
(45) Date of Patent: Aug. 19, 2014

(54) MEMS DEVICE WITH STRESS ISOLATION AND METHOD OF FABRICATION

(75) Inventor: Aaron A. Geisberger, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 253 days.

(21) Appl. No.: 13/365,454

(22) Filed: Feb. 3, 2012

(65) Prior Publication Data

US 2012/0126345 A1    May 24, 2012

Related U.S. Application Data

(62) Division of application No. 12/548,232, filed on Aug. 26, 2009, now Pat. No. 8,138,007.

(51) Int. Cl.
*H01L 23/48*    (2006.01)
*H01L 23/52*    (2006.01)
*H01L 29/40*    (2006.01)

(52) U.S. Cl.
USPC .... 257/735; 257/728; 257/678; 257/E21.305; 257/E21.32; 257/E21.327; 257/E21.329; 257/E21.347; 257/E21.499; 257/E21.517; 257/E21.612

(58) Field of Classification Search
USPC ......... 257/735, 728, 734, 678, 247, 396, 414, 257/659, 660, 689
See application file for complete search history.

(56) References Cited

U.S. PATENT DOCUMENTS

| 5,983,721 | A  | 11/1999 | Sulzberger et al. |
| 6,428,713 | B1 | 8/2002  | Christenson et al. |
| 6,461,888 | B1 | 10/2002 | Sridhar et al. |
| 6,770,506 | B2 | 8/2004  | Gogoi |
| 7,023,083 | B2 | 4/2006  | Jakobsen |

(Continued)

FOREIGN PATENT DOCUMENTS

| DE | 19928291 A1 | 12/1999 |
| DE | 102007047592 | 4/2009 |

(Continued)

OTHER PUBLICATIONS

PCT Application No. PCT/US2010/044517; Search Report and Written Opinion dated Mar. 23, 2011.

(Continued)

*Primary Examiner* — David Nhu

(74) *Attorney, Agent, or Firm* — Schmeiser, Olsen & Watts LLP; Lowell W. Gresham; Charlene R. Jacobsen

(57) ABSTRACT

A MEMS device (20) with stress isolation includes elements (28, 30, 32) formed in a first structural layer (24) and elements (68, 70) formed in a second structural layer (26), with the layer (26) being spaced apart from the first structural layer (24). Fabrication methodology (80) entails forming (92, 94, 104) junctions (72, 74) between the layers (24, 26). The junctions (72, 74) connect corresponding elements (30, 32) of the first layer (24) with elements (68, 70) of the second layer (26). The fabrication methodology (80) further entails releasing the structural layers (24, 26) from an underlying substrate (22) so that all of the elements (30, 32, 68, 70) are suspended above the substrate (22) of the MEMS device (20), wherein attachment of the elements (30, 32, 68, 70) with the substrate (22) occurs only at a central area (46) of the substrate (22).

20 Claims, 8 Drawing Sheets

(56) References Cited

U.S. PATENT DOCUMENTS

| | | |
|---|---|---|
| 7,074,637 B2 * | 7/2006 | Lutz et al. .............. 438/50 |
| 7,444,873 B2 | 11/2008 | Robert |
| 7,755,454 B2 | 7/2010 | Tanaka et al. |
| 8,138,007 B2 * | 3/2012 | Geisberger ............. 438/52 |
| 8,516,890 B2 | 8/2013 | Rehle |
| 2005/0255645 A1 | 11/2005 | Lutz et al. |
| 2007/0170525 A1 | 7/2007 | Eskridge |
| 2008/0290430 A1 | 11/2008 | Mahadevan et al. |

FOREIGN PATENT DOCUMENTS

| | | |
|---|---|---|
| EP | 1717194 B1 | 11/2006 |
| EP | 1760036 A1 | 3/2007 |
| JP | H10-111312 | 4/1998 |
| JP | H11-201984 | 7/1999 |
| JP | 2006-189431 | 7/2006 |
| JP | H10-111312 | 4/2010 |
| WO | 2004010150 A2 | 1/2004 |
| WO | 2009047120 A2 | 4/2009 |

OTHER PUBLICATIONS

European Patent Office, "Extended European Search Report", May 13, 2014, pp. 1-5, Europe.

* cited by examiner

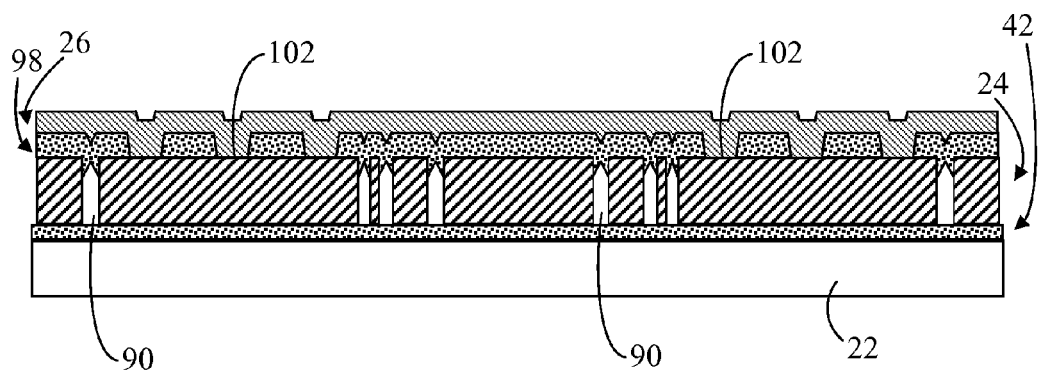
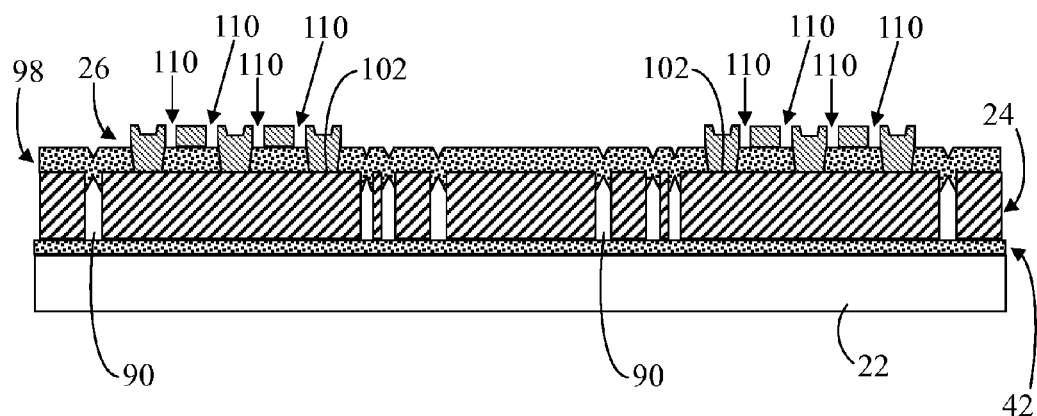
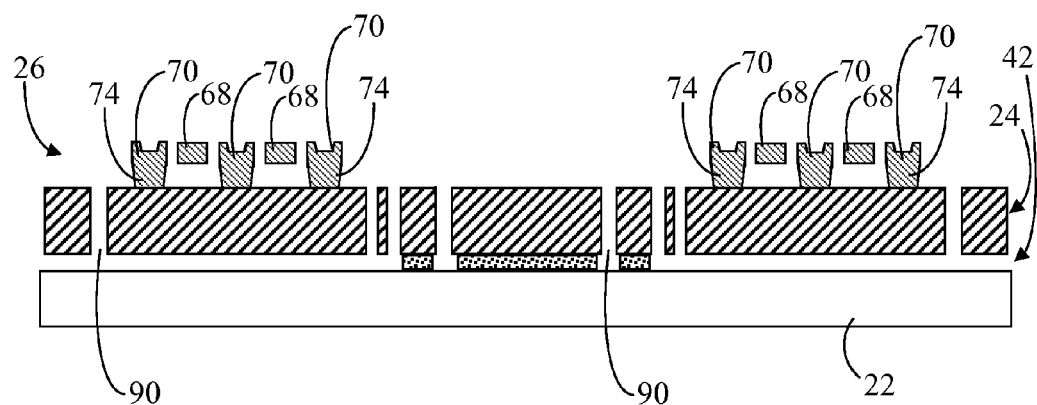

MEMS DEVICE WITH STRESS ISOLATION AND METHOD OF FABRICATION

RELATED INVENTION

The present invention is a divisional of "MEMS Device With Stress Isolation and Method of Fabrication," U.S. patent application Ser. No. 12/548,232, filed 26 Aug. 2009, now U.S. Pat. No. 8,138,007, which is incorporated by reference herein.

TECHNICAL FIELD OF THE INVENTION

The present invention relates generally to microelectromechanical systems (MEMS) devices. More specifically, the present invention relates to a MEMS device with stress isolation and fabrication methodology for the MEMS device.

BACKGROUND OF THE INVENTION

Microelectromechanical Systems (MEMS) sensor devices are widely used in applications such as automotive, inertial guidance systems, household appliances, protection systems for a variety of devices, and many other industrial, scientific, and engineering systems. Such MEMS devices are used to sense a physical condition such as acceleration, pressure, or temperature, and to provide an electrical signal representative of the sensed physical condition. Capacitive-sensing MEMS sensor designs are highly desirable for operation in high gravity environments and in miniaturized devices, and due to their relatively low cost.

Many MEMS sensor device applications require smaller size and low cost packaging to meet aggressive cost targets. In addition, MEMS device applications are calling for lower temperature coefficient of offset (TCO) specifications. TCO is a measure of how much thermal stresses effect the performance of a semiconductor device, such as a MEMS device. A high TCO indicates correspondingly high thermally induced stress. The fabrication and packaging of MEMS device applications often uses various materials with dissimilar coefficients of thermal expansion. As the various materials expand and contract at different rates in the presence of temperature changes, the active transducer layer of the MEMS device may experience stretching, bending, warping and other deformations due to the different dimensional changes of the different materials. Thus, significant thermal stress, i.e., an undesirably high TCO, often develops during manufacture or operation.

In addition, stresses can result from soldering the packaged MEMS device onto a printed circuit board in an end application. These package stresses can change the strain of the substrate on which the MEMS sensor is mounted causing offset shifts, or displacements. Moreover, the substrate may undergo some non-constant strain such as non-uniform stretching, bending, or warping across a surface of the substrate. The displacement induced by package stress and substrate strain can cause changes in the sense signal, thus adversely affecting the output performance of the MEMS device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 9 shows a side view of the device of FIG. 8 in a subsequent stage of processing;

FIG. 10 shows a side view of the device of FIG. 9 in a subsequent stage of processing;

FIG. 11 shows a side view of the device of FIG. 9 in a subsequent stage of processing;

DETAILED DESCRIPTION

An embodiment of the invention entails a microelectromechanical systems (MEMS) transducer, referred to herein as a MEMS device, in which the MEMS device is largely isolated from the underlying substrate. This isolation is achieved by significantly reducing the connection of elements to the substrate, relative to prior art devices, and by locating the connections within close proximity of one another and at a centralized area of the substrate. Another embodiment of the invention entails a method for fabricating the MEMS device using two structural layers, in which one structural layer achieves sense capability within the plane of the layer and the other structural layer suspends the fixed elements of the MEMS device so that they are not in direct contact with the underlying substrate.

Figure 1:
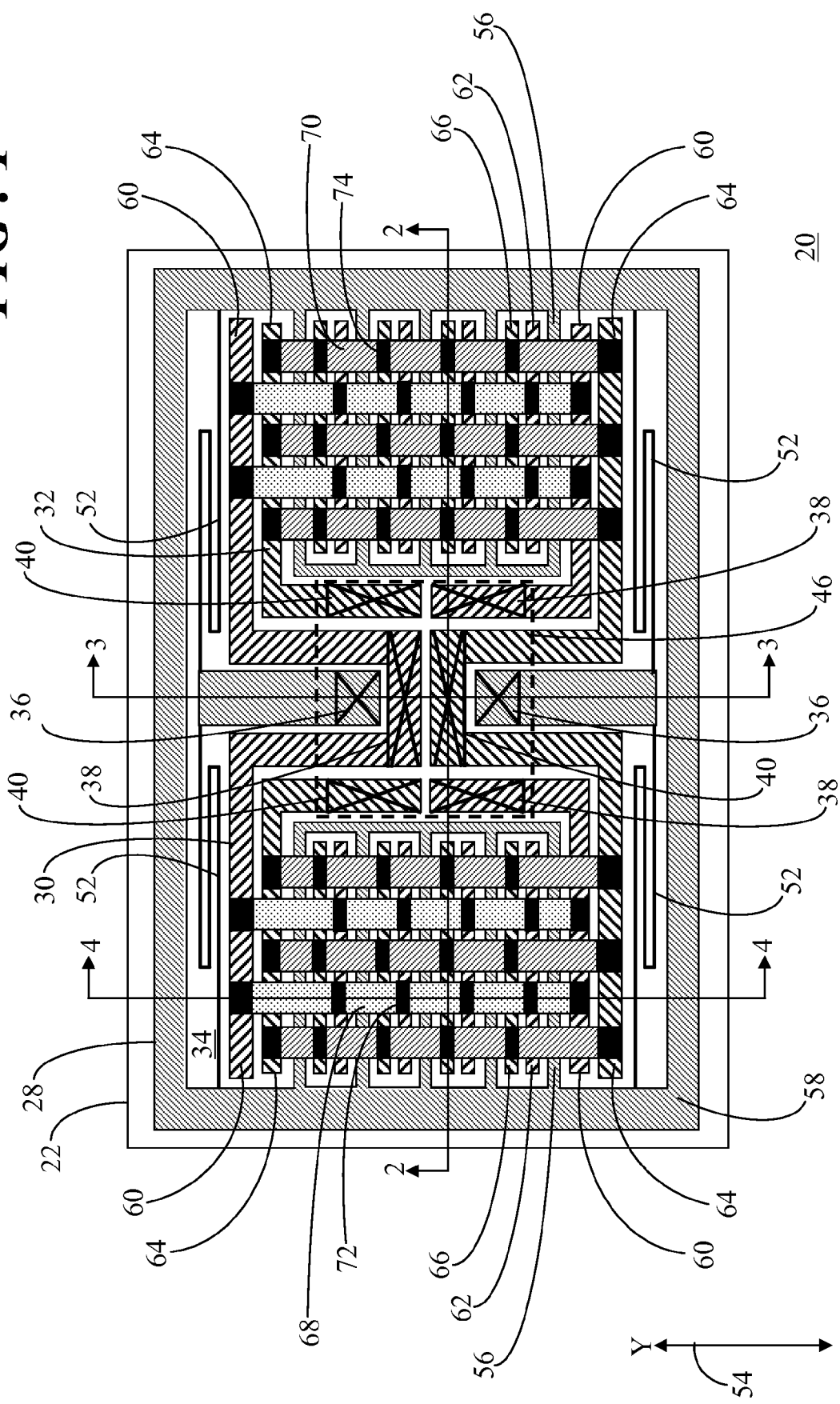
FIG. 1 shows a top view of a MEMS device in accordance with an embodiment of the invention.
Figure 2:
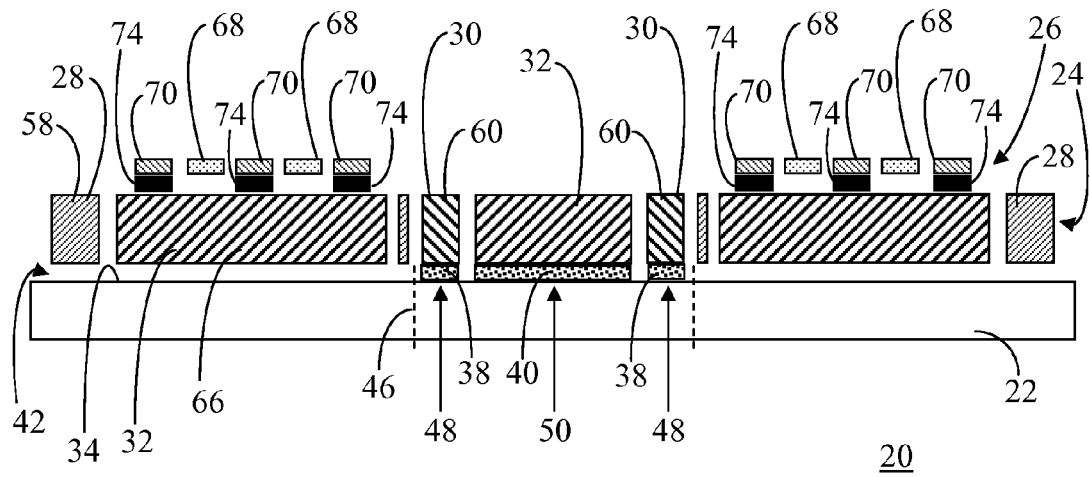
FIG. 2 shows a side view of the MEMS device of FIG. 1 along section line 2-2.
Figure 3:
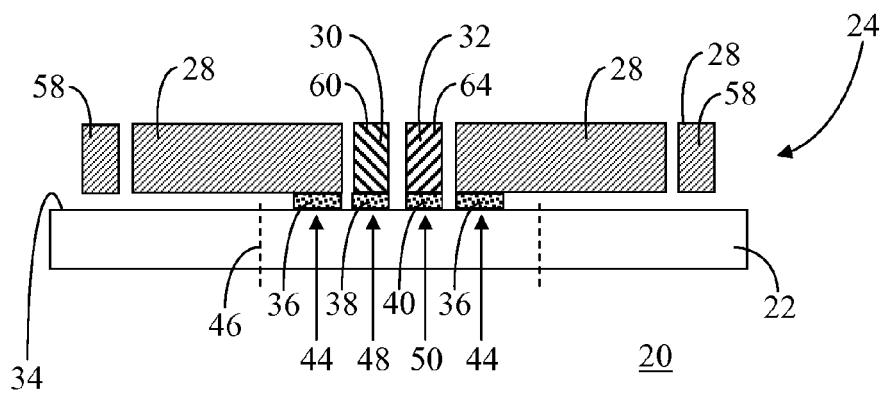
FIG. 3 shows a side view of the MEMS device of FIG. 1 along section line 3-3.
Figure 4:
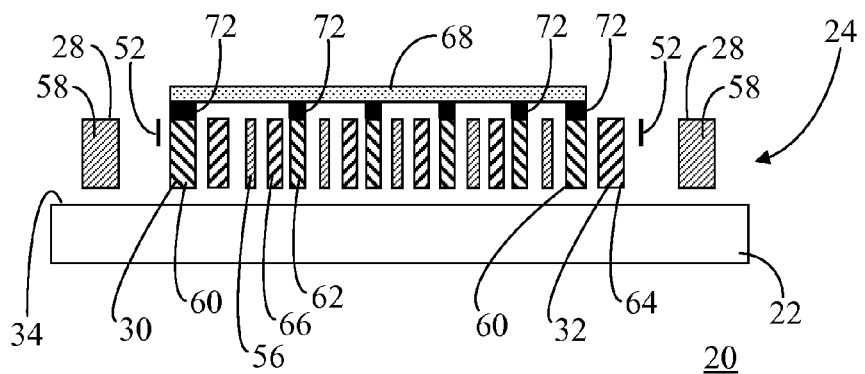
FIG. 4 shows a side view of the MEMS device of FIG. 1 along section line 4-4.

Referring now to FIGS. 1-4, FIG. 1 schematically shows a top view of a MEMS device 20 in accordance with an embodiment of the invention. FIG. 2 shows a side view of MEMS device 20 along section line 2-2 in FIG. 1. FIG. 3 shows a side view of MEMS device 20 along section line 3-3 in FIG. 1, and FIG. 4 shows a side view of MEMS device 20 along section line 4-4 in FIG. 1. FIGS. 1-4 are illustrated using various shading and/or hatching to distinguish the different elements produced within the structural layers of MEMS device 20, as will be discussed below. These different elements within the structural layers may be produced utilizing current and upcoming surface micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

The elements of MEMS device 20 (discussed below) may be described variously as being "attached to," "attached with," "coupled to," "fixed to," or "interconnected with," other elements of MEMS device 20. However, it should be understood that the terms refer to the direct or indirect physical connections of particular elements of MEMS device 20 that occur during their formation through patterning and etching processes of MEMS fabrication, as will be discussed in connection with FIG. 5.

MEMS device 20 includes a substrate 22, a first structural layer 24, and a second structural layer 26. A number of elements are formed in first structural layer 24. In an embodiment, these elements include a moveable element, referred to herein as a proof mass 28, a first immovable element 30, and a second immovable element 32. Proof mass 28 is represented by upwardly and rightwardly directed narrow hatching. First immovable element 30 is represented by downwardly and rightwardly directed wide hatching, and second immovable element 32 is represented by upwardly and rightwardly directed wide hatching. The terms "first" and "second" used herein do not refer to an ordering or prioritization of elements within a countable series of elements. Rather, the terms "first" and "second" are used to distinguish the two movable elements 30 and 32 for clarity of discussion.

Proof mass 28, first immovable element 30, and second immovable element 32 are suspended above a surface 34 of substrate 22 (best seen in FIGS. 2-4) and are configured for attachment with substrate 22 at a central area 46 of surface 34 of substrate 22. Proof mass 28 is anchored to substrate 22 via one or more proof mass anchors 36 (for example, two anchors 36). Likewise, first immovable element 30 is anchored to substrate 22 via one or more first anchors 38 (for example, three anchors 38), and second immovable element 32 is anchored to substrate 22 via one or more second anchors 40 (for example, three anchors 40). In an embodiment, anchors 36, 38, and 40 are formed when a portion of a sacrificial layer 42 remains beneath proof mass 28 and immovable elements 30 and 32 following etching of sacrificial layer 42 during processing (discussed below). Sacrificial layer 42 is denoted in FIGS. 2 and 3 by a dark stippled pattern. Again, the terms "first" and "second" do not refer to an ordering or prioritization of elements within a countable series of elements. Rather, the term "first" is used to associate anchors 38 with first immovable element 30 and the term "second" is used to anchors 40 with second immovable element 32 for clarity of discussion.

In FIG. 1, anchors 36, 38, and 40 are represented by "X" marks over their corresponding elements 28, 30, and 32. In an embodiment, proof mass anchors 36 attach proof mass 28 at anchor regions 44 in central area 46 of substrate 22. Likewise, first anchors 38 attach first immovable element 30 at anchor regions 48 in central area 46 of substrate 22, and second anchors 40 attach second immovable element 32 at anchor regions 50 in central area 46 of substrate 22. Accordingly, central area 46 is defined by a "center" of substrate 22 relative to the location of proof mass 28, first immovable element 30, and second immovable element 32 on substrate 22.

One or more compliant members 52, or springs, interconnect proof mass 28 with proof mass anchors 36. In an embodiment, compliant members 52 allow movement of proof mass 28 in a single direction, referred to herein as a Y-direction 54, that is parallel to a plane, i.e., the planar surface 34 of substrate 22. Proof mass 28 includes a number of movable fingers or electrodes, referred to herein as projections 56, all of which are connected with an outer frame 58 of proof mass 28. Projections 56 extend substantially parallel to planar surface 34 of substrate 22.

First and second immovable elements 30 and 32 are attached to substrate 34 via respective first and second anchors 38 and 40 so that elements 30 and 32 are immovable, i.e., fixed, relative to proof mass 28. First immovable element 30 includes one or more frame structures 60 (in this example, three frame structures 60) attached to first anchors 38 and a number of fixed electrodes 62 that extend substantially parallel to planar surface 34 of substrate 22. Fixed electrodes 62 may be some combination of sense electrodes and/or actuator electrodes and are referred to herein as first fixed fingers 62. Similarly, immovable element 32 includes one or more frame structures 64 (in this example, three frame structures 64) attached to anchors 40 and a number of fixed electrodes 66 that extend substantially parallel to planar surface 34 of substrate 22. Fixed electrodes 66 may also be some combination of sense electrodes and/or actuator electrodes and are referred to herein as second fixed fingers 66. Pairs of first and second fixed fingers 62 and 66 are interleaved with projections 56 of proof mass 28.

First and second fixed fingers 62 and 66 are "fixed" or immovable relative to proof mass 28 through their connection with respective frame structures 60 and 64 via elements formed in second structural layer 26. These elements formed in second structural layer 26 include one or more beams 68, referred to herein as first beams 68, and one or more beams 70, referred to herein as second beams 70. Again, the terms "first" and "second" do not refer to an ordering or prioritization of elements within a countable series of elements. Rather, the term "first" is used to associate beams 68 with first immovable element 30 and the term "second" is used to associate beams 70 with second immovable element 32 for clarity. First beams 68 are represented by a light stippled pattern and second beams 70 are represented by downwardly and rightwardly directed narrow hatching. In the illustrated embodiment, proof mass 28 may be considered a "first element," first immovable element 30 may be considered a "second element," one or more first beams 68 may be considered a "third element," second immovable element 32 may be considered a "fourth element," and one or more second beams 70 may be considered a "fifth element".

First beams 68 are connected to first fingers 62 of first immovable element 30 via multiple first junctions 72 formed on and extending above first fingers 62. In addition, first beams 68 are connected with the appropriate frame structure 60 of first immovable element 30. It should be noted that each of first fingers 62 is a distinct component of first immovable element 30 and is formed in first structural layer 24 without connection to frame structure 60 and first anchors 38. First beams 68 are coupled to first junctions 72 so that first fingers 62 are interconnected with one another and with the appropriate frame structure 60 of first immovable element 30 so that first fingers 62 are held suspended over substrate 22 following removal of sacrificial layer 42 (discussed below). However, projections 56 and second fingers 66 are not connected to first beams 68. Thus, each of projections 56 is interposed between a pair of first fingers 62, and first beams 68 traverse, i.e., are oriented across, a location of projections 56 to attach to each of first fingers 62 via first junctions 72.

Likewise, second beams 70 are connected to second fingers 66 of second immovable element 32 via multiple second junctions 74 formed on and extending above second fingers 66. In addition, second beams 70 are connected with the appropriate frame structure 64 of second immovable element 32. Like first fingers 62, each of second fingers 66 is a distinct component of second immovable element 32 and is formed in first structural layer 24 without connection to frame structure 64 and second anchors 40. Second beams 70 are coupled to second junctions 74 so that second fingers 66 are interconnected with one another and with the appropriate frame structure 64 of second immovable element 32 so that second fingers 66 are held suspended over substrate 22 following removal of sacrificial layer 42 (discussed below). However, projections 56 and first fingers 62 are not connected to second beams 70. Thus, it should be noted that each of projections 56 is also interposed between a pair of second fingers 66, and second beams 70 traverse a location of projections 56 to attach to each of second fingers 66 via second junctions 74. First and second junctions 72 and 74 are represented in FIGS. 1, 2, and 4 by solid black shading.

In the illustrated embodiment, MEMS device 20 may be an accelerometer having capacitive sensing capability. In general, compliant members 52 suspend proof mass 28 over substrate 22 in a neutral position parallel to substrate 22 until the selective application of force, due to some other means, causes a deflection thereof. By way of example, proof mass 28 of MEMS device 20 moves when MEMS device 20 experiences acceleration in Y-direction 54. Lateral movement of proof mass 28 in Y-direction 54 may be detected by first and second fixed fingers 62 and 66 interleaved with proof mass 28, as known to those skilled in the art. This lateral movement can subsequently be converted via electronics (not shown) into a signal having a parameter magnitude (e.g. voltage, current, frequency, etc.) that is dependent on the acceleration. In this example, MEMS device 20 may be a single axis accelerometer for detection of lateral movement in Y-direction 54. However, alternative embodiments may entail dual axis accelerometers or other MEMS sensing devices.

As discussed above, stress from packaging of a MEMS device, such as MEMS device 20, and/or its solder connection to an underlying printed circuit board can change the strain of substrate 22 causing offset shifts or displacements that lead to sensor inaccuracy. Furthermore, the strain profile of the substrate 22 may be inconsistent across the plane of substrate 22. In MEMS device 20, the adverse affects of an inconsistent strain profile are mitigated by the suspended configuration of first and second immovable elements 30 and 32 over substrate 22, by the reduced connection of proof mass 28 and immovable elements 30 and 32 to substrate 22, and by locating all connections, i.e., anchors 36, 38, and 40, within close proximity and in central area 46 of substrate 22.

Figure 5:
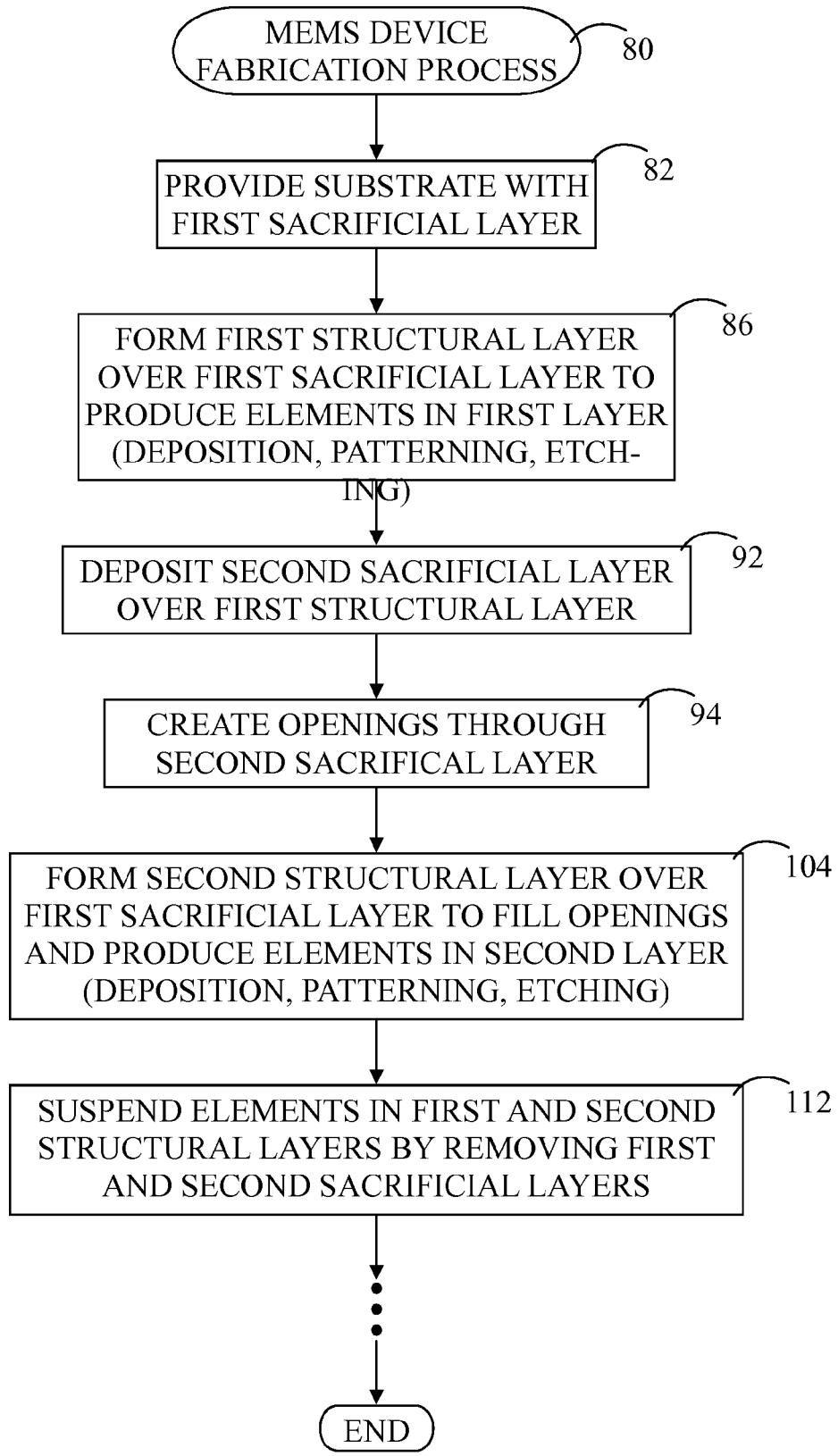
FIG. 5 shows a flowchart of a microelectromechanical systems (MEMS) device fabrication process in accordance with another embodiment of the invention.

FIG. 5 shows a flowchart of a MEMS device fabrication process 80 in accordance with another embodiment of the invention. MEMS device fabrication process 80 provides methodology for fabricating a MEMS device that is largely isolated from an underlying substrate through the suspension of fixed elements above the substrate. Process 80 will be discussed in connection with the fabrication of MEMS device 20 (FIG. 1). However, it should become apparent that the following methodology can be adapted to fabricate other MEMS device designs in which stress isolation for improved offset performance is desired.

Fabrication process 80 is described below in connection with the fabrication of a single MEMS device 20 for simplicity of illustration. However, it should be understood by those skilled in the art that the following process allows for concurrent manufacturing of a plurality of MEMS devices 20. For example, multiple MEMS devices 20 may undergo concurrent semiconductor thin-film manufacturing on substrate 22. The individual MEMS devices 20 can then be cut, or diced, in a conventional manner to provide individual MEMS devices 20 that can be packaged and coupled onto a printed circuit board in an end application.

MEMS device fabrication process 80 begins with an activity 82. At activity 82, substrate 22 is provided with first sacrificial layer 42 deposited thereon.

Figure 6:
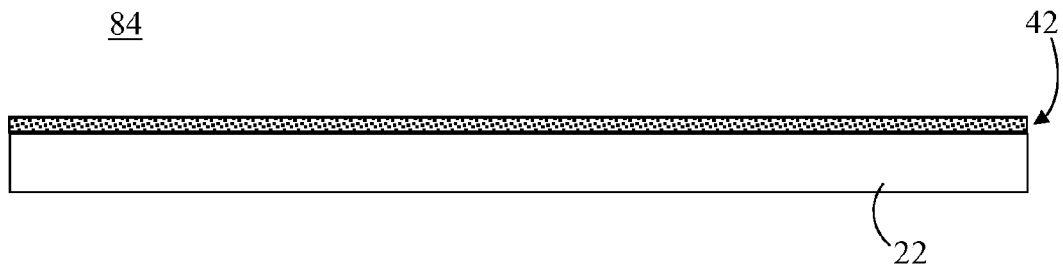
FIG. 6 shows a side view of the MEMS device of FIG. 1 in a beginning stage of processing.

Referring to FIG. 6 in connection with activity 82, FIG. 6 shows a side view of MEMS device 20 (FIG. 1) in a beginning stage 84 of processing in accordance with activity 82. At beginning stage 84, substrate 22 is provided. Substrate 22 may be a silicon wafer with a blanket layer of sacrificial layer 42, for example, phosphosilicate glass (PSG), that is provided from a wafer provider. Alternatively, substrate 22 may be provided from a provider. Following receipt of substrate 22, sacrificial layer 42 may then be deposited over substrate 22 by the manufacturing facility fabricating MEMS device 20. Although silicon wafer and PSG are mentioned, those skilled in the art will recognized that substrate 22 and sacrificial layer 42 may be formed from other types of materials, and/or substrate 22 may also be formed in multiple layers. In an optional embodiment, sacrificial layer 42 may be etched at anchor regions 44, 48, and 50 (FIG. 1) to form openings (not shown) for the eventual fabrication of anchors 36, 38, and 40 (FIG. 1).

With reference back to MEMS device fabrication process 80 (FIG. 5), following activity 82, an activity 86 is performed. At activity 86, first structural layer 24 (FIG. 3) is formed over sacrificial layer 42 (FIG. 6) to produce at least proof mass 28, first movable element 30, and second movable element 32 in first structural layer 24.

Figure 7:
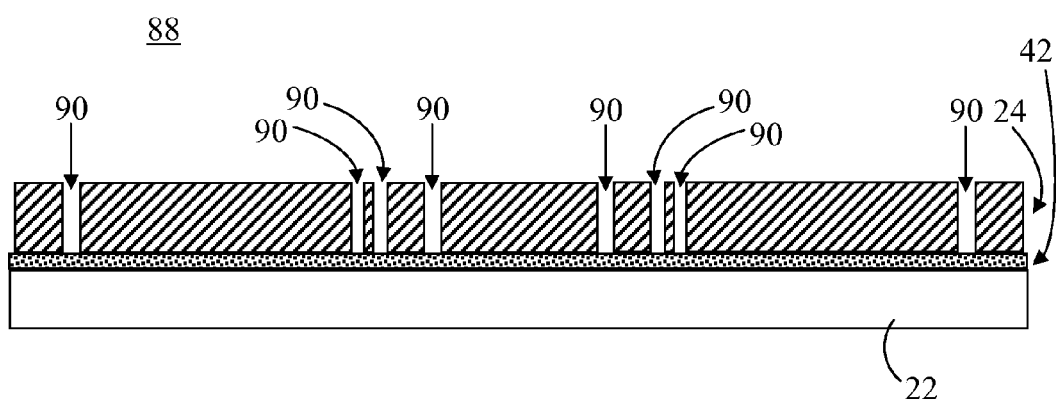
FIG. 7 shows a side view of the device of FIG. 6 in a subsequent stage of processing.

Referring to FIG. 7 in connection with task 86, FIG. 7 shows a side view of the device of FIG. 6 in a subsequent stage 88 of processing. At stage 88, material such as polysilicon, is deposited on sacrificial layer 42 to form first structural layer 24. First structural layer 24 is patterned and etched to produce proof mass 28, first immovable element 30, and second immovable element 32 (FIG. 1). In addition, if sacrificial layer 42 was previously etched at anchor regions 44, 48, and 50, the deposition of first structural layer 24 over sacrificial layer 42 will fill the openings in sacrificial layer 42 to produce anchors 36, 38, and 40 (FIG. 1). Patterning and etching process techniques yield trenches 90 that physically separate elements 28, 30, and 32 from one another. In this illustration, elements 28, 30, and 32 produced in first structural layer 24 are not distinguished from one another. Rather, a single rightwardly and upwardly directed wide hatch pattern is utilized to represent first structural layer 24.

With reference back to MEMS device fabrication process 80 (FIG. 5), following activity 86, an activity 92 is performed. At activity 92, a second sacrificial layer is deposited over first structural layer 24. Process 80 continues with an activity 94. At activity 94, openings are created through the second sacrificial layer.

Figure 8:
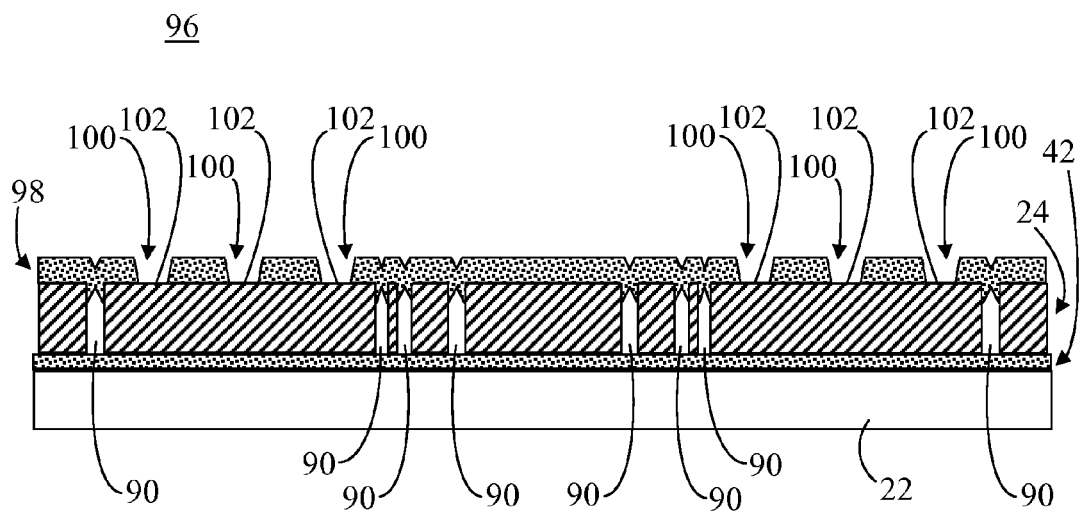
FIG. 8 shows a side view of the device of FIG. 7 in a subsequent stage of processing.

Referring to FIG. 8 in connection with activities 92 and 94, FIG. 8 shows a side view of the device of FIG. 7 in a subsequent stage 96 of processing. At stage 96, another sacrificial layer 98 of, for example, PSG is deposited on first structural layer 24 in accordance with activity 92. Sacrificial layer 98 at least partially fills trenches 90 etched through first structural layer 24 at activity 86 (FIG. 5). Sacrificial layer 98 is then patterned and etched to create a number of openings 100 through sacrificial layer 98 to expose a portion 102 of first structural layer 24, and particularly to expose portions 102 of first immovable element 30 (FIG. 1) and second immovable element 32 (FIG. 1).

With reference back to MEMS device fabrication process 80 (FIG. 5), following activity 92, an activity 104 is performed. At activity 104, second structural layer 26 (FIG. 3) is formed over sacrificial layer 98 (FIG. 8) to produce at least first beams 68 and second beams 70 (FIG. 1).

Referring to FIG. 9 in connection with activity 104, FIG. 9 shows a side view of the device of FIG. 8 in a subsequent stage 106 of processing. At stage 106, another layer of material such as polysilicon is deposited on sacrificial layer 98 to form second structural layer 26. The deposition of second structural layer 26 over sacrificial layer 98 fills openings 102 in sacrificial layer 98 to create respective first and second junctions 72 and 74 (FIGS. 1, 3, and 4).

FIG. 10 shows a side view of the device of FIG. 9 in a subsequent stage 108 of processing. At stage 108, second structural layer 26 is patterned and etched to produce first beams 68 and second beams 70 (FIG. 1). Interconnects (not shown) can be included as necessary. Patterning and etching process techniques of activity 104 (FIG. 5) yield trenches or spaces 110 that physically separate elements beams 68 and 70 from one another. In this illustration, elements 68 and 70 and junctions 72 and 74 produced in second structural layer 26 are not distinguished from one another. Rather, a single rightwardly and downwardly directed narrow hatch pattern is utilized to represent the elements of second structural layer 26.

With reference back to MEMS device fabrication process 80 (FIG. 5), following activity 104, an activity 112 is performed. At activity 112, the elements in first and second structural layers 24 and 26 are suspended over substrate 22 by removing first and second sacrificial layers 42 and 98 by employing, for example, an etching technique.

Referring to FIG. 11 in connection with task 112, FIG. 11 shows a side view of the device of FIG. 10 in a subsequent stage 114 of processing. At stage 114, sacrificial layers 98 and 42 are etched using known processes to release proof mass 28, immovable elements 30 and 32, and compliant members 52 from the underlying substrate 22. FIG. 11 generally represents the side view of MEMS device 20 along section line 2-2 of FIG. 1 as also shown in FIG. 2. However, like the previous processing illustrations of FIGS. 6-10, the various elements produced in first and second structural layers 24 and 26 and first and second junctions 72 and 74 are not distinguished from one another in FIG. 11. Rather, these various elements can be readily ascertained from FIG. 2.

In an embodiment, the etching of sacrificial layers 98 and 42 at activity 112 removes substantially an entirety of sacrificial layer 98 (FIG. 10) so that beams 68 and 70 of second structural layer 26 are spaced apart from first structural layer 24 with the exception of junctions 72 and 74. The etching of sacrificial layers 98 and 42 at activity 112 further results in removal of substantially an entirety of sacrificial layer 42 underlying proof mass 28, first and second immovable elements 30 and 32, and compliant members 52 so that they are suspended above and spaced apart from substrate 22. However, in an embodiment, sacrificial layer 42 remains in anchor regions 44, 48, and 50 so that proof mass 28 and immovable elements 30, 32 are attached to substrate 22 via anchors 36, 38, and 40.

The selective removal of sacrificial layers 98 and 42 can be achieved by making certain regions of proof mass 28 and immovable elements 30 and 32 porous to an etch material, or etchant. This porosity may be accomplished by fabricating first and second structural layers 24 and 26 with throughholes (not shown for simplicity of illustration). The throughholes can provide passage through which an etchant can pass to reach the underlying sacrificial layers 98 and 42. Of course, through-holes need not be fabricated through at least first structural layer 24 at anchor regions 44, 48, and 50 so that sacrificial layer that underlies regions 44, 48, and 50 will remain following a suitably timed etching process. This porosity may alternatively be accomplished by the properties of the material used to fabricate first and second structural layers 24 and 26. For example, the properties of the material used to fabricate first and second structural layers 24 and 26 may be such that the etchant can permeate through the material of first and second structural layers 24 and 26 to reach the underlying sacrificial layers 98 and 42 without damage to first and second structural layers 24 and 26.

With reference back to MEMS device fabrication process 80 (FIG. 5), following task 112, MEMS device fabrication process 80 may include other activities that are not discussed herein for brevity. These additional fabrication activities, represented by ellipses, may include hermetically sealing MEMS device 20, forming electrical interconnects, and so forth. Following fabrication of MEMS device 20, fabrication process 80 ends with first and second beams 68 and 70, respectively, connected to their corresponding first and second fixed fingers 62 and 66 via corresponding first and second junctions 72 and 74. First and second beams 68 and 70 are additionally connected to their respective frame structures 60 and 64 which are, in turn, connected to the underlying substrate 22 by their respective first and second anchors 38 and 40 in order to provide structural integrity so that first and second fixed fingers 62 and 66 are held suspended above substrate 22 by beams 68 and 70.

Figure 12:
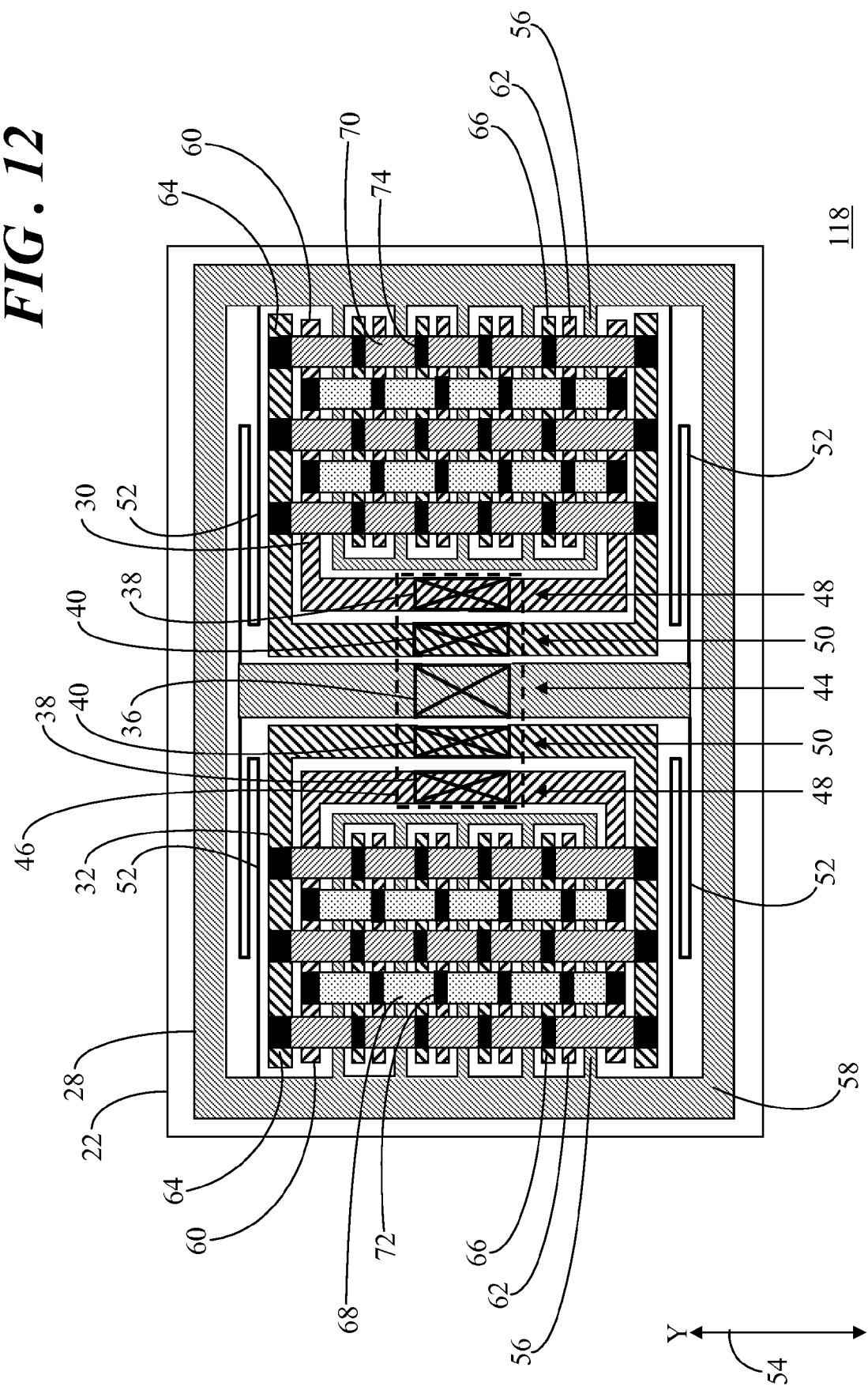
FIG. 12 shows a top view of a MEMS device in accordance with another embodiment of the invention.

FIG. 12 shows a top view of a MEMS device 118 in accordance with another embodiment of the invention. MEMS device 118 is provided to demonstrate that elements within the structural layers can be arranged in various ways. In accordance with the shading and/or hatching in FIGS. 1-4, the same shading and/or hatching is utilized in conjunction with FIG. 12 to distinguish the different elements produced within the structural layers of MEMS device 118.

MEMS device 118 includes substrate 22 and first and second structural layers, best seen in connection with MEMS device 20 (FIGS. 1-4). Proof mass 28, first immovable element 30, second immovable element 32, and compliant members 52 are formed in the first structural layer, as discussed in detail above, and are suspended above surface 34 of substrate 22. In addition, MEMS device 118 includes first and second beams 68 and 70 formed in the second structural layer, as well as first and second junctions 72 and 74 interconnecting respective first and second beams 68 and 70 with respective first and second immovable elements 30 and 32, as discussed above. In the illustrated embodiment of FIG. 12, proof mass 28 may be considered a "first element," first immovable element 30 may be considered a "second element," one or more first beams 68 may be considered a "third element," second immovable element 32 may be considered a "fourth element," and one or more second beams 70 may be considered a "fifth element".

In this illustrative embodiment, proof mass 28 is anchored to substrate 22 via one proof mass anchor 36, first immovable element 30 is anchored to substrate 22 via two anchors 38, and second immovable element 32 is anchored to substrate 34 via two anchors 40 all of which are located at respective anchor regions 44, 48, and 50 at central area 46 of substrate 22. Thus, attachment of the elements of the first structural layer is accomplished using fewer anchors than MEMS device 20. However, the anchors are still located within close proximity to one another and are centralized with respect to substrate 22 for mitigating the adverse affects of an inconsistent strain profile through the suspended configuration of first and second immovable elements 30 and 32 over substrate 22, by the reduced connection of proof mass 28 and immovable elements 30 and 32 to substrate 22.

Like MEMS device 20, proof mass 28 of MEMS device 118 includes projections 56 connected with outer frame 58. Likewise, first immovable element 30 includes first fixed fingers 62, and second immovable element 32 includes second fixed fingers 66. However, the anchor configuration of MEMS device 118 yields a different configuration for the frame structures of first and second immovable elements 30 and 32. In this instance, first immovable element 30 includes two frame structures 60 and second immovable element 32 includes two frame structures 64 all of which are generally U-shaped. Accordingly, stress isolation of first and second immovable elements 30 and 32 is achieved through the suspension of first and second fixed fingers 62 and 66 via the beams and frame structures, as discussed above.

Figure 13:
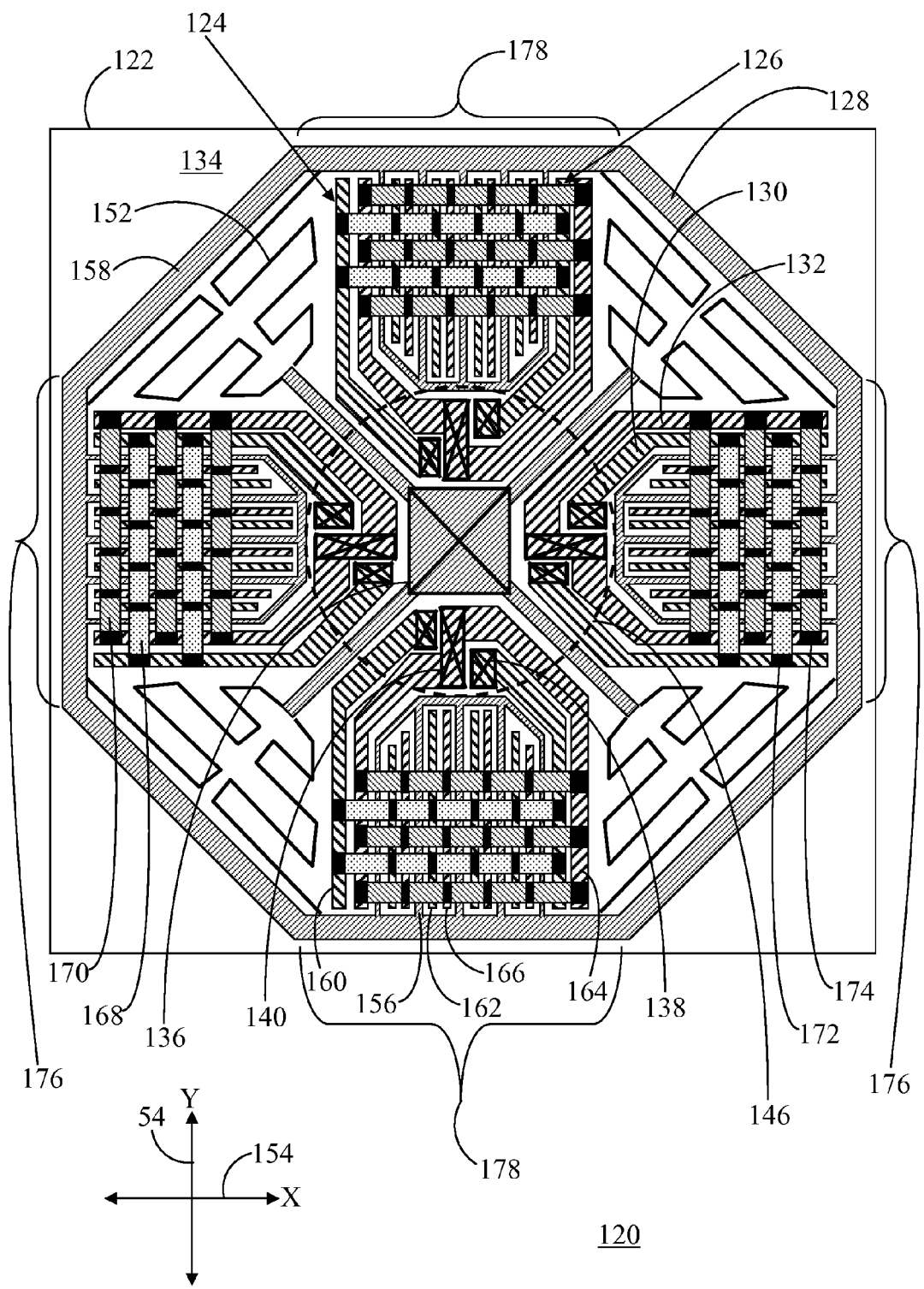
FIG. 13 shows a top view of a MEMS device in accordance with another embodiment of the invention.

FIG. 13 shows a top view of a MEMS device 120 in accordance with yet another embodiment of the invention. MEMS devices 20 and 118 are configured as single axis accelerometers for detecting acceleration in Y-direction 54. In the alternative embodiment of FIG. 13, principles of the invention are applied to a dual axis accelerometer MEMS device 120. In accordance with the shading and/or hatching in FIGS. 1-4, the same shading and/or hatching is utilized in conjunction with FIG. 13 to distinguish the different elements produced within the structural layers of MEMS device 120.

MEMS device 120 includes a substrate 122, a first structural layer 124, and a second structural layer 126. A number of elements are formed in first structural layer 124. In an embodiment, these elements include a proof mass 128 (upwardly and rightwardly directed narrow hatching), a first immovable element 130 (represented by downwardly and rightwardly directed wide hatching), and a second immovable element 132 (represented by upwardly and rightwardly directed wide hatching). MEMS device 120 can be fabricated in accordance with MEMS device fabrication process 80 (FIG. 5).

Proof mass 128, first immovable element 130, and second immovable element 132 are suspended above a surface 134 of substrate 122. Proof mass 128 is attached to substrate 122 via one or more proof mass anchors 136 (for example, a single anchor 136). Likewise, first immovable element 130 is attached to substrate 122 via one or more first anchors 138 (for example, eight anchors 138), and second immovable element 132 is anchored to substrate 34 via one or more second anchors 140 (for example, four anchors 40). Anchors 136, 138, and 140 are represented by "X" marks over their corresponding elements 128, 130, and 132. As illustrated, proof mass anchor 136 attaches proof mass 128 at an anchor region at a generally central area 146 of substrate 122. Likewise, first anchors 138 attach first immovable element 130 at an anchor at central area 146 of substrate 122, and second anchors 140 attach second immovable element 132 at an anchor regions at central area 146 of substrate 122.

One or more compliant members 152, or springs, interconnect proof mass 128 with proof mass anchor 136. In an embodiment, compliant members 152 allow movement of proof mass 128 in two directions that are orthogonal to one another and are parallel to a plane, i.e., the planar surface 134 of substrate 122. These two directions include Y-direction 54 direction and an X-direction 154.

Proof mass 128 includes a number of movable projections 156, all of which are connected with an outer frame 158 of proof mass 128. Projections 156 extend substantially parallel to planar surface 134 of substrate 122. In addition, first immovable element 130 includes one or more frame structures 160 attached to first anchors 138 and a number of first fixed fingers 162 that extend substantially parallel to planar surface 134 of substrate 122. Similarly, immovable element 132 includes one or more frame structures 164 attached to anchors 140 and a number of second fixed fingers 166 that extend substantially parallel to planar surface 134 of substrate 122. Pairs of first and second fixed fingers 162 and 166 are interleaved with projections 156 of proof mass 128. Thus, first and second immovable elements 130 and 132 are attached to substrate 122 via respective first and second anchors 138 and 140 so that elements 130 and 132 are immovable, i.e., fixed, relative to proof mass 128.

First and second fixed fingers 162 and 166 are "fixed" or immovable relative to proof mass 28 through their connection with respective frame structures 160 and 164 via elements formed in second structural layer 126. These elements formed in second structural layer 26 include one or more first beams 168 (represented by a light stippled pattern) and one or more second beams 170 (represented by downwardly and rightwardly directed narrow hatching). In the illustrated embodiment of FIG. 13, proof mass 128 may be considered a "first element," first immovable element 130 may be considered a "second element," one or more first beams 168 may be considered a "third element," second immovable element 132 may be considered a "fourth element," and one or more second beams 170 may be considered a "fifth element".

First beams 168 are connected to first fingers 162 of first immovable element 130 via multiple first junctions 172 formed on and extending above first fingers 162. In addition, first beams 168 are connected with the appropriate frame structure 160 of first immovable element 130. It should be noted that each of first fingers 162 is a distinct component of first immovable element 130 and is formed in first structural layer 124 without connection to frame structure 160 and first anchors 138. First beams 168 are coupled to first junctions 172 so that first fingers 162 are interconnected with one another and with the appropriate frame structure 160 of first immovable element 130. Thus, first fingers 162 are held suspended over substrate 122.

Likewise, second beams 170 are connected to second fingers 166 of second immovable element 132 via multiple second junctions 174 formed on and extending above second fingers 166. In addition, second beams 170 are connected with the appropriate frame structure 164 of second immovable element 132. Like first fingers 162, each of second fingers 166 is a distinct component of second immovable element 132 and is formed in first structural layer 124 without connection to frame structure 164 and second anchors 140. Second beams 170 are coupled to second junctions 174 so that second fingers 166 are interconnected with one another and with the appropriate frame structure 164 of second immovable element 132. Thus, second fingers 166 are held suspended over substrate 122. First and second junctions 172 and 174 are represented in FIG. 13 by solid black shading.

In the illustrated embodiment, MEMS device 120 may be an accelerometer having capacitive sensing capability. In general, compliant members 152 suspend proof mass 128 over substrate 122 in a neutral position parallel to substrate 122 until the selective application of force in either of Y-direction 54 or X-direction 154, due to some other means, causes a deflection thereof. Lateral movement of proof mass 128 in Y-direction 54 may be detected by a subset 176 of first and second fixed fingers 162 and 166 interleaved with proof mass 128 that are oriented substantially perpendicular to Y-direction 54. Likewise, lateral movement of proof mass 128 in X-direction 154 may be detected by a subset 178 of first and second fixed fingers 162 and 166 interleaved with proof mass 128 that are oriented substantially perpendicular to X-direction 154. The lateral movement in either of Y-direction 54 and/or X-direction 154 can subsequently be converted via electronics (not shown) into signals having a parameter magnitude (e.g. voltage, current, frequency, etc.) that is dependent on the acceleration.

Figure 14:
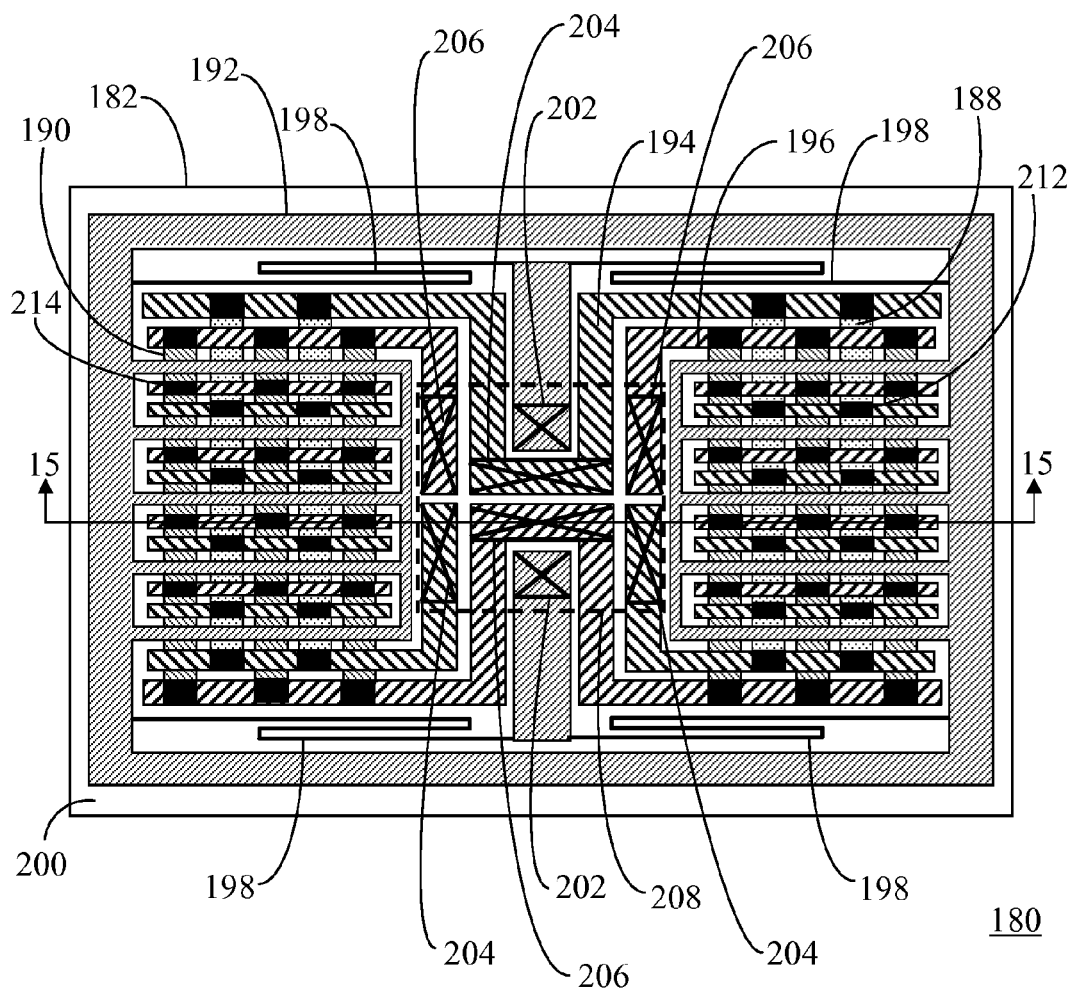
FIG. 14 shows a top view of a MEMS device in accordance with another embodiment of the invention.
Figure 15:
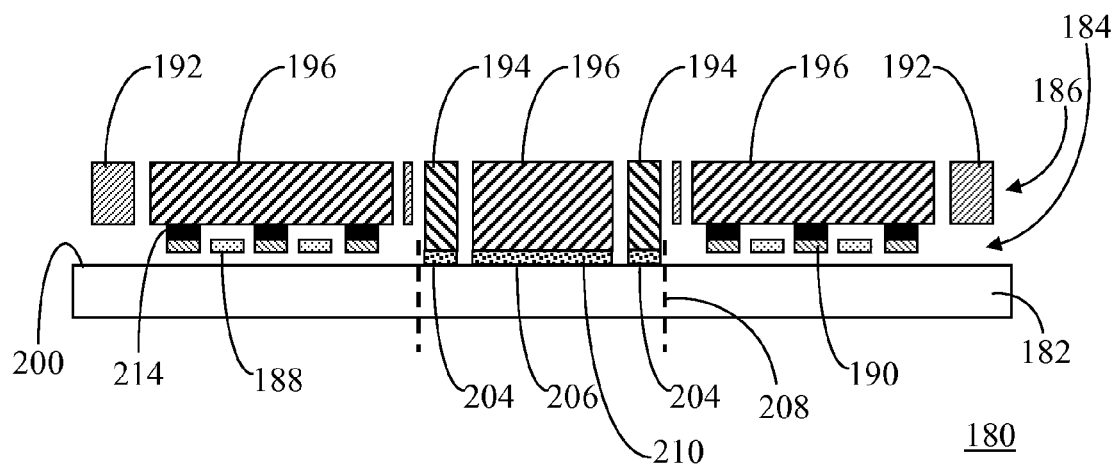
FIG. 15 shows a side view of the MEMS device of FIG. 14 along section line 15-15.

Referring to FIGS. 14 and 15, FIG. 14 shows a top view of a MEMS device 180 in accordance with another embodiment of the invention, and FIG. 15 shows a side view of MEMS device 180 along section line 15-15 in FIG. 14. The above described fabrication methodology is discussed in connection with the formation of a relatively thinner second structural layer 26 (FIG. 2) overlying a relatively thicker first structural layer 24 (FIG. 2). In other embodiments, it may be desirable to deposit relatively thinner underlying layers prior to deposition of relatively thicker overlying layers. In the alternative embodiment of FIGS. 14 and 15, principles of the MEMS device fabrication methodology are applied to a single axis accelerometer MEMS device 180 having a relatively thinner first structural layer and a relatively thicker second structural layer overlying the first structural layer. In accordance with the shading and/or hatching in FIGS. 1-4, the same shading and/or hatching is utilized in conjunction with FIGS. 14 and 15 to distinguish the different elements produced within the structural layers of MEMS device 180.

MEMS device 180 includes a substrate 182, a first structural layer 184, and a second structural layer 186. Elements formed in first structural layer 184 include first beams 188 (represented by a light stippled pattern) and second beams 190 (represented by downwardly and rightwardly directed narrow hatching). Elements formed in second structural layer 186 include a proof mass 192 (represented by upwardly and rightwardly directed narrow hatching), a first immovable element 194 (represented by downwardly and rightwardly directed wide hatching), a second immovable element 196 (represented by upwardly and rightwardly directed wide hatching), and compliant members 198.

Proof mass 192, first immovable element 194, second immovable element 196, and compliant members 198 are suspended above a surface 200 of substrate 182 (best seen in FIG. 15). Proof mass 192 is anchored to substrate 182 via one or more proof mass anchors 202. Likewise, first immovable element 194 is anchored to substrate 182 via one or more first anchors 204, and second immovable element 196 is anchored to substrate 182 via one or more second anchors 206. In FIG. 14, anchors 202, 204, and 206 are represented by "X" marks over their corresponding elements 192, 194, and 196.

In an embodiment, anchors 202, 204, and 206 may be formed by building up sacrificial and structural layers at a central area 208 of substrate 182 so that anchors 202, 204, and 206 attach with corresponding elements 192, 194, and 196 produced in second structural layer 186. A sacrificial layer 210 attaches anchors 202, 204, and 206 to the underlying substrate 182 at central area 208 and is denoted in FIG. 15 by a dark stippled pattern.

The remaining features of proof mass 192, first immovable element 194, second immovable element 196, and compliant members 198 are similar in design to proof mass 28, first immovable element 30, second immovable element 32, and compliant members 52 (FIGS. 1-4). Accordingly, discussion of the particular features of elements 28, 30, 32, and 52 applies equally to elements 192, 194, 196, and 198 and will not be repeated herein for brevity.

First junctions 212 connect first beams 188 with portions (e.g., fixed fingers and frame structure) of first immovable element 194. Likewise, second junctions 214 connect second beams 190 with portions (e.g., fixed fingers and frame structure) of second immovable element 196. MEMS device 180 (including the elements produced in first and second structural layers 184 and 186 and first and second junctions 212 and 214) may be fabricated in accordance with MEMS device fabrication process 80 (FIG. 5). In the illustrated embodiment of FIGS. 14 and 15, first beam 188 may be considered a "first element," second beam 190 may be considered a "second element," first immovable element 194 may be considered a "third element," and second immovable element 196 may be considered a "fourth element".

Referring to FIG. 5 in connection with FIGS. 14 and 15, first and second beams 188 and 190 are formed in first structural layer 184 through the execution of activity 86 of MEMS device fabrication process 80. Next, a second sacrificial layer (not shown) is deposited over first structural layer 184 and openings (not shown) are made for first and second junctions 212 and 214 through the execution of activities 92 and 94. Second structural layer 186 is then formed to produce proof mass 192, first immovable element 194, second immovable element 196, and compliant members 198 through the execution of activity 104. The various elements of first and second structural layers 184 and 186 are subsequently suspended, or released, from the underlying substrate 182 by removing the sacrificial layers in accordance with activity 112. Furthermore, the relatively thinner beams 188 and 190 provide sufficient structural stability to retain immovable elements 194 and 196 suspended above substrate 182 and only anchored with substrate 182 at central area 208.

Embodiments described herein comprise MEMS sensors that are stress isolated from an underlying substrate. Stress isolation of the immovable elements formed in one structural layer is achieved by supporting the elements through a second structural layer in the fabrication process. The design approach calls for junctions connecting elements of the two structural layers. The two structural layers are subsequently released, or detached, from the underlying substrate. Accordingly, elements in one structural layer can achieve sense capability within the layer plane and the other structural layer holds the immovable, i.e., fixed, elements so that they are not in direct contact with the substrate. This enables the anchor connections to the substrate to be in close proximity and centralized with respect to the substrate. The centralized configuration of anchors and the minimized quantity of anchors reduces the adverse effects of inconsistencies and irregularities of strain across the plane of the substrate. Thus, such a MEMS device is less susceptible to thermally induced package stress gradients, and can be readily implemented as a low cost, compact, single die transducer utilizing conventional manufacturing processes.

Although the preferred embodiments of the invention have been illustrated and described in detail, it will be readily apparent to those skilled in the art that various modifications may be made therein without departing from the spirit of the invention or from the scope of the appended claims. For example, the MEMS device may be adapted to include a different number of centralized anchors and/or beams. In addition, the proof mass, immovable elements, the beams, the compliant members, and so forth can take on various other shapes and sizes then those which is shown.

What is claimed is:

1. A microelectromechanical systems (MEMS) device comprising:
   a substrate;
   a first element and a second element formed in a first structural layer, both of said first and second elements being suspended over a portion of said substrate, said second element being immovably coupled with said substrate, and attachment of said second element with said substrate occurs only at a central area on said substrate relative to a location of said first and second elements over said substrate;
   a third element formed in a second structural layer over said first structural layer and spaced apart from said first structural layer; and a junction formed between said second and third elements, said junction coupling said third element with said second element.

2. The MEMS device as claimed in claim 1 further comprising a material layer overlying said central area of said substrate between said substrate and said first structural layer, said material layer being absent from said portion of said substrate over which said first and second elements are suspended, so that said first and second elements are spaced apart from said portion of said substrate.

3. The MEMS device as claimed in claim 1 further comprising:
   a first anchor attached to said substrate;
   a compliant member interconnected between said first element and said first anchor to allow movement of said first element substantially parallel to a plane of said substrate; and
   a second anchor at said central area of said substrate and coupled with said second element so that said second element is immovable relative to said first element.

4. The MEMS device as claimed in claim 3 further comprising:
   a fourth element formed in said first structural layer and suspended over said portion of said substrate; and
   a third anchor at said central area of said substrate and coupled with said fourth element so that said fourth element is immovable relative to said first element and is spaced apart from said portion of said substrate.

5. The MEMS device as claimed in claim 3 wherein said compliant member allows movement of said first element in a first direction and in a second direction that is perpendicular to said first direction, each of said first and second directions being substantially parallel to said plane of said substrate.

6. The MEMS device as claimed in claim 1 wherein:
   said first element includes projections extending substantially parallel to a plane of said substrate;
   said second element includes fingers interleaved with said projections;
   said third element is formed in said second structural layer as a beam; and
   said MEMS device further comprises multiple junctions extending between said first and second structural layers and coupling said beam with said fingers of said second element, said junction being one of said multiple junctions, said beam being coupled to said junctions so that said fingers are interconnected with one another via said beam, and said projections are not connected to said beam.

7. The MEMS device as claimed in claim 6 wherein at least one of said projections is interposed between a pair of said fingers, said beam is oriented across a location of said at least one of said projections, and said beam is attached to each of said pair of said fingers via said junctions.

8. The MEMS device as claimed in claim 6 wherein said first and second elements formed in said first structural layer are thicker than said beam formed in said second structural layer.

9. The MEMS device as claimed in claim 6 wherein said fingers are first fingers, said junctions are first junctions, said beam is a first beam, and said MEMS device further comprises:
   a fourth element formed in said first structural layer and suspended over said portion of said substrate, said fourth element including second fingers interleaved with said projections;
   a fifth element formed in said second structural layer, said fifth element being formed as a second beam; and
   multiple second junctions extending between said first and second structural layers and coupling said second beam with said second fingers of said fourth element, said second beam being coupled to said second junctions so that said second fingers of said fourth element are interconnected with one another via said second beam, and said projections and said first fingers are not connected to said second beam.

10. The MEMS device as claimed in claim 1 wherein:
    said first element is formed in said first structural layer as a beam;
    said third element formed in said second structural layer includes fingers; and
    said MEMS device further comprises:
       a movable element formed in said second structural layer and suspended over said portion of said substrate, said movable element including projections extending substantially parallel to a plane of said substrate, wherein said fingers of said third element are interleaved with said projections; and
       multiple junctions extending between said first and second structural layers and coupling said beam with said fingers of said third element, said junction being one of said multiple junctions, said beam being coupled to said junctions so that said fingers of said third element are interconnected with one another via said beam, and said projections are not connected to said beam.

11. The MEMS device as claimed in claim 10 wherein said second structural layer is thicker than said first structural layer.

12. The MEMS device as claimed in claim 10 further comprising:
    a first anchor attached to said substrate;
    a compliant member interconnected between said movable element and said first anchor to allow movement of said movable element substantially parallel to a plane of said substrate; and
    a second anchor at said central area of said substrate and coupled with said third element so that said first and third elements are immovable relative to said movable element.

13. The MEMS device as claimed in claim 10 wherein said fingers are first fingers, said junctions are first junctions, said beam is a first beam, said second element is formed in said first structural layer as a second beam, and said MEMS device further comprises:
    a fourth element formed in said second structural layer and suspended over said portion of said substrate, said fourth element including second fingers that are interleaved with said projections of said movable element; and
    multiple second junctions extending between said first and second structural layers and coupling said second beam with said second fingers of said fourth element, said second beam being coupled to said second junctions so that said second fingers of said fourth element are interconnected with one another via said second beam, and said projections are not connected to said second beam.

14. A microelectromechanical systems (MEMS) device comprising:
    a substrate;
    a first element and a second element formed in a first structural layer, both of said first and second elements being suspended over a portion of said substrate, said second element being immovably coupled with said substrate, and attachment of said second element with said substrate occurs only at a central area on said substrate relative to a location of said first and second elements over said substrate, wherein said first element includes projections extending substantially parallel to a plane of said substrate, and said second element includes fingers interleaved with said projections;

a material layer overlying said central area of said substrate between said substrate and said first structural layer, said material layer being absent from said portion of said substrate over which said first and second elements are suspended, so that said first and second elements are spaced apart from said portion of said substrate;

a third element formed in a second structural layer over said first structural layer and spaced apart from said first structural layer, said third element being formed as a beam; and multiple junctions extending between said first and second structural layers and coupling said beam with said fingers of said second element, said beam being coupled to said junctions so that said fingers of said second element are interconnected with one another via said beam, and said projections are not connected to said beam.

15. The MEMS device as claimed in claim 14 further comprising:
a first anchor attached to said substrate;
a compliant member interconnected between said first element and said first anchor to allow movement of said first element substantially parallel to a plane of said substrate; and
a second anchor at said central area of said substrate and coupled with said second element so that said fingers of said second element are immovable relative to said first element.

16. The MEMS device as claimed in claim 14 wherein said first and second elements formed in said first structural layer are thicker than said beam formed in said second structural layer.

17. The MEMS device as claimed in claim 14 wherein said fingers are first fingers, said junctions are first junctions, said beam is a first beam, and said MEMS device further comprises:
a fourth element formed in said first structural layer and suspended over said portion of said substrate, said fourth element including second fingers interleaved with said projections;
a fifth element formed in said second structural layer, said fifth element being formed as a second beam; and
multiple second junctions extending between said first and second structural layers and coupling said second beam with said second fingers of said fourth element, said second beam being coupled to said second junctions so that said second fingers of said fourth element are interconnected with one another via said second beam, and said projections are not connected to said second beam.

18. A microelectromechanical systems (MEMS) device comprising:
a substrate;
a first element and a second element formed in a first structural layer, both of said first and second elements being suspended over a portion of said substrate, said first element being immovably coupled with said substrate, and attachment of said first element with said substrate occurs only at a central area on said substrate relative to a location of said first and second elements over said substrate, wherein said first element is formed in said first structural layer as a beam;

a material layer overlying said central area of said substrate between said substrate and said first structural layer, said material layer being absent from said portion of said substrate over which said first and second elements are suspended, so that said first and second elements are spaced apart from said portion of said substrate;

a third element formed in a second structural layer over said first structural layer and spaced apart from said first structural layer, said third element including fingers;

a movable element formed in said second structural layer and suspended over said portion of said substrate, said movable element including projections extending substantially parallel to a plane of said substrate, wherein said fingers of said third element are interleaved with said projections; and multiple junctions extending between said first and second structural layers and coupling said beam with said fingers of said third element, said beam being coupled to said junctions so that said fingers of said third element are interconnected with one another via said beam, and said projections are not connected to said beam.

19. The MEMS device as claimed in claim 18 wherein said second structural layer is thicker than said first structural layer.

20. The MEMS device as claimed in claim 18 further comprising:
a first anchor attached to said substrate;
a compliant member interconnected between said movable element and said first anchor to allow movement of said movable element substantially parallel to a plane of said substrate; and
a second anchor at said central area of said substrate and coupled with said third element so that said first and third elements are immovable relative to said movable element.

* * * * *

UNITED STATES PATENT AND TRADEMARK OFFICE
CERTIFICATE OF CORRECTION

| | | |
|---|---|---|
| PATENT NO. | : 8,810,030 B2 | Page 1 of 1 |
| APPLICATION NO. | : 13/365454 | |
| DATED | : August 19, 2014 | |
| INVENTOR(S) | : Aaron A. Geisberger | |

It is certified that error appears in the above-identified patent and that said Letters Patent is hereby corrected as shown below:

At the top of Title page 1, item (45), following "Date of Patent:" please replace "Aug. 19, 2014" with --*Aug. 19, 2014--.

Signed and Sealed this
Sixth Day of January, 2015

Michelle K. Lee
*Deputy Director of the United States Patent and Trademark Office*